US009118337B2

(12) United States Patent
Ohhata

(10) Patent No.: US 9,118,337 B2
(45) Date of Patent: Aug. 25, 2015

(54) ANALOG-DIGITAL CONVERTER

(71) Applicant: KAGOSHIMA UNIVERSITY, Kagoshima-shi, Kagoshima (JP)

(72) Inventor: Kenichi Ohhata, Kagoshima (JP)

(73) Assignee: KAGOSHIMA UNIVERSITY, Kagoshima (JP)

( * ) Notice: Subject to any disclaimer, the term of this patent is extended or adjusted under 35 U.S.C. 154(b) by 0 days.

(21) Appl. No.: 14/405,760

(22) PCT Filed: Jun. 5, 2013

(86) PCT No.: PCT/JP2013/065631
§ 371 (c)(1),
(2) Date: Dec. 4, 2014

(87) PCT Pub. No.: WO2013/183688
PCT Pub. Date: Dec. 12, 2013

(65) Prior Publication Data

US 2015/0180494 A1 Jun. 25, 2015

(30) Foreign Application Priority Data

Jun. 5, 2012 (JP) ................................ 2012-128031

(51) Int. Cl.
*H03M 1/12* (2006.01)
*H03M 1/00* (2006.01)
(Continued)

(52) U.S. Cl.
CPC ............ *H03M 1/002* (2013.01); *H03M 1/0845* (2013.01); *H03M 1/361* (2013.01);
(Continued)

(58) Field of Classification Search
CPC ......... H03M 1/00; H03M 1/12; H03M 7/165; H03M 1/1225; G06F 7/00
USPC .......... 341/156, 155, 158, 160, 118, 137, 141
See application file for complete search history.

(56) References Cited

U.S. PATENT DOCUMENTS 5,194,866 A * 3/1993 Imaizumi et al. ............. 341/156
7,710,304 B2 5/2010 Kumamoto et al.
2009/0027247 A1 1/2009 Kumamoto et al.

FOREIGN PATENT DOCUMENTS

JP H01-200822 A 8/1989
JP H03-185931 A 8/1991
(Continued)

OTHER PUBLICATIONS

International Search Report of PCT/JP2013/065631 dated Jul. 2, 2013.

*Primary Examiner* — Joseph Lauture
(74) *Attorney, Agent, or Firm* — Arent Fox LLP

(57) ABSTRACT

A parallel-type AD converter includes: a plurality of comparators that receive comparison reference potentials different from one another and compare the comparison reference potentials and received analog input signals; an encoder that encodes outputs of the plurality of comparators to output digital signals; and a resistor ladder circuit that resistance-divides a reference voltage to generate the comparison reference potentials and supplies the comparison reference potentials to the comparators through output nodes each positioned between resistors, and is designed to supply a correction current corresponding to noise currents that the comparators generate to the output nodes of the comparison reference potentials in the resistor ladder circuit, and thereby the noise currents that the comparators generate are offset by the correction current, a bias current in the resistor ladder circuit can be decreased, and accuracy deterioration in AD conversion can be suppressed.

8 Claims, 12 Drawing Sheets

(51) Int. Cl.

| | |
|---|---|
| ***H03M 1/36*** | (2006.01) |
| ***H03M 1/08*** | (2006.01) |
| *G02F 7/00* | (2006.01) |
| *H03M 7/16* | (2006.01) |

(52) U.S. Cl.

CPC . *G02F 7/00* (2013.01); *H03M 1/00* (2013.01); *H03M 1/12* (2013.01); *H03M 1/1225* (2013.01); *H03M 7/165* (2013.01)

(56) References Cited

FOREIGN PATENT DOCUMENTS

| | | | |
|---|---|---|---|
| JP | H04815 | A | 1/1992 |
| JP | 2009-033303 | A | 2/2009 |

* cited by examiner

F I G. 1
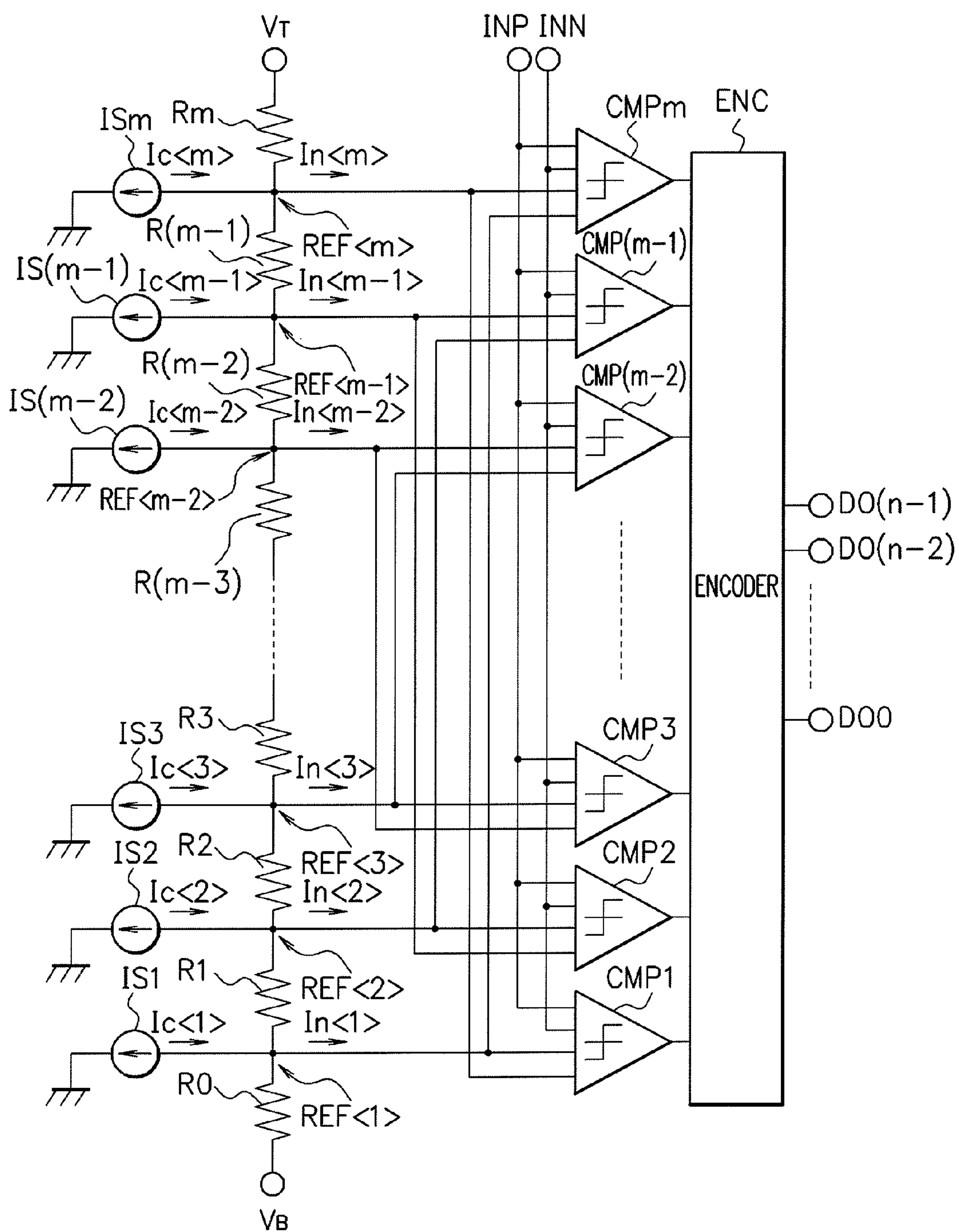

F I G. 2
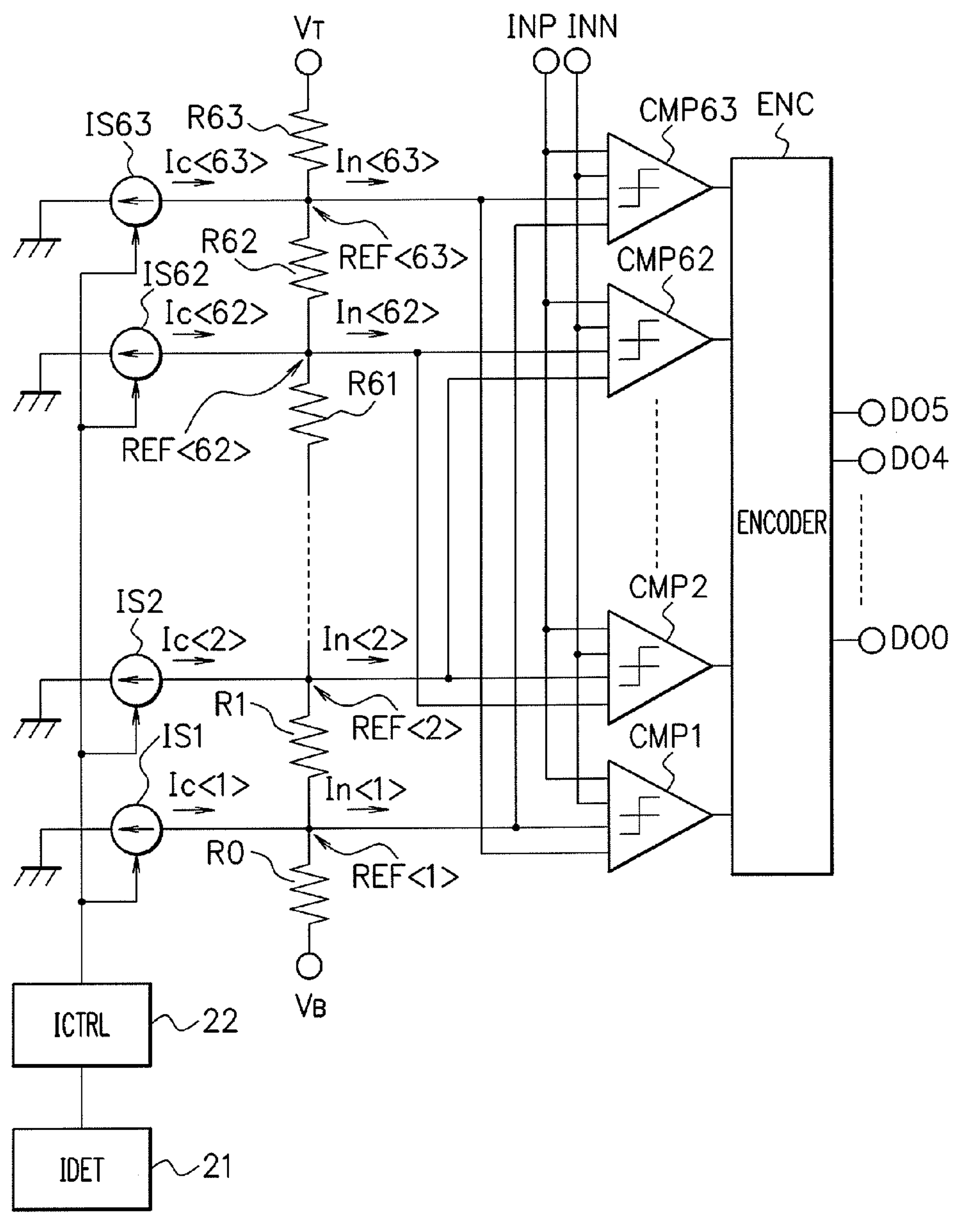

F I G. 3
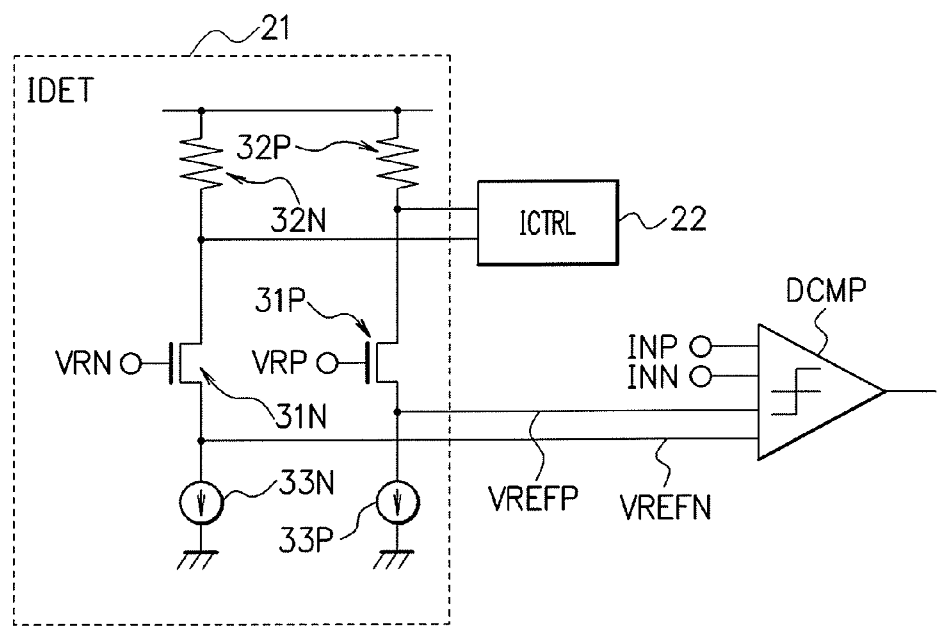

F I G. 4A
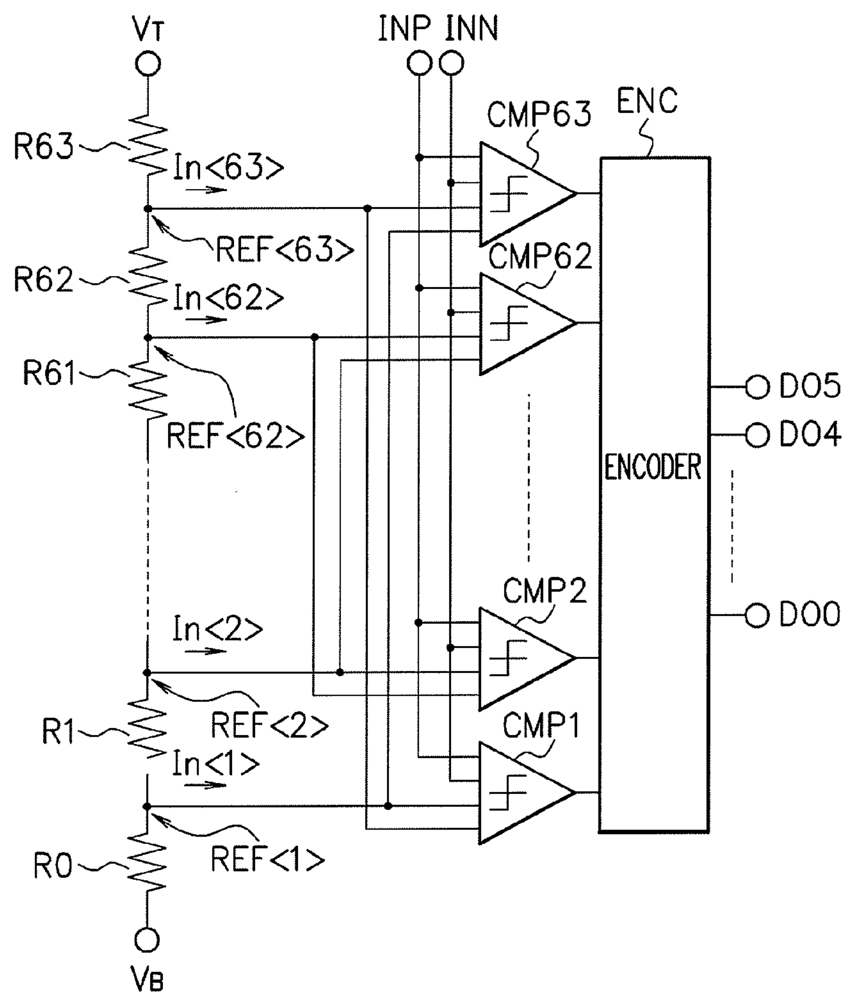
F I G. 4B
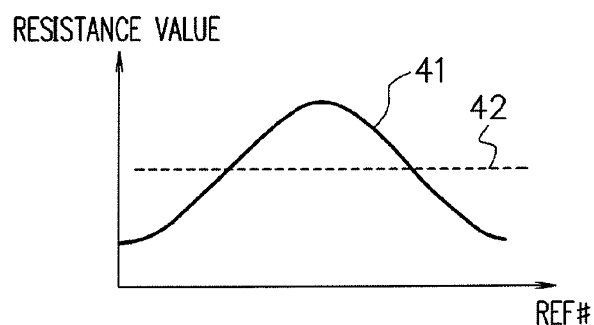

F I G. 4C
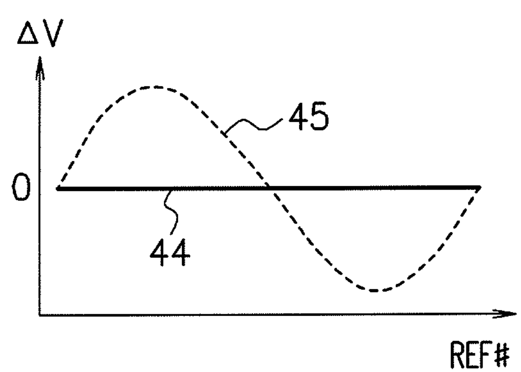

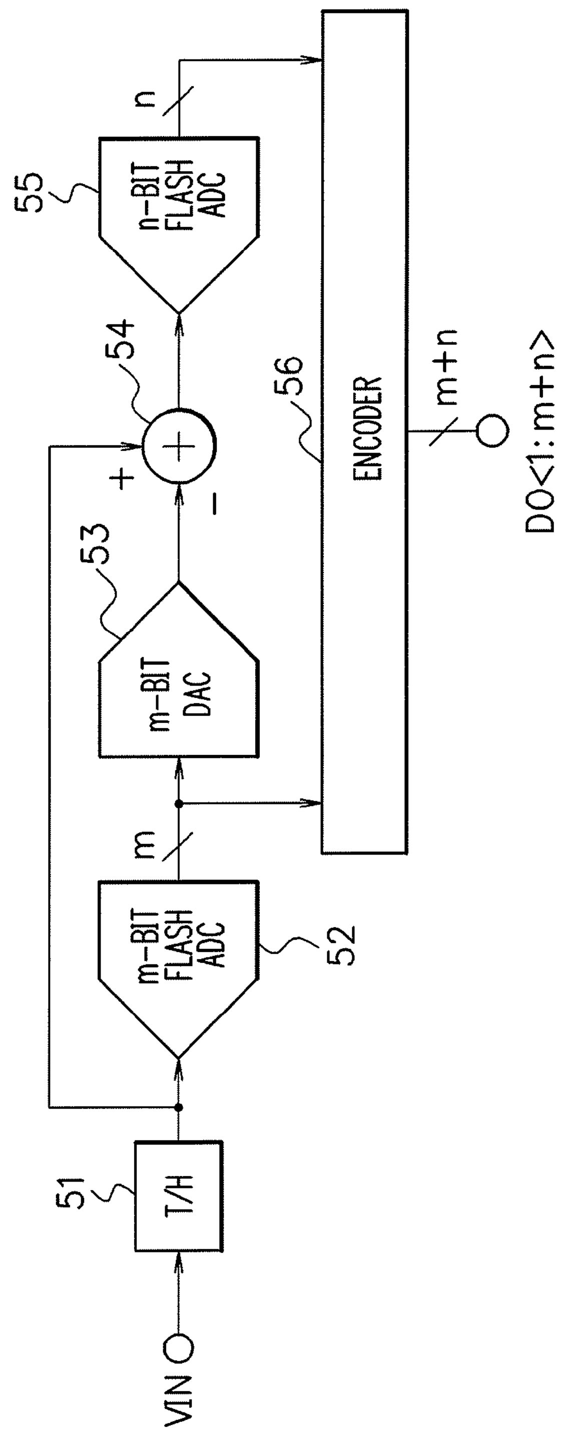
F I G. 5

F I G. 6A
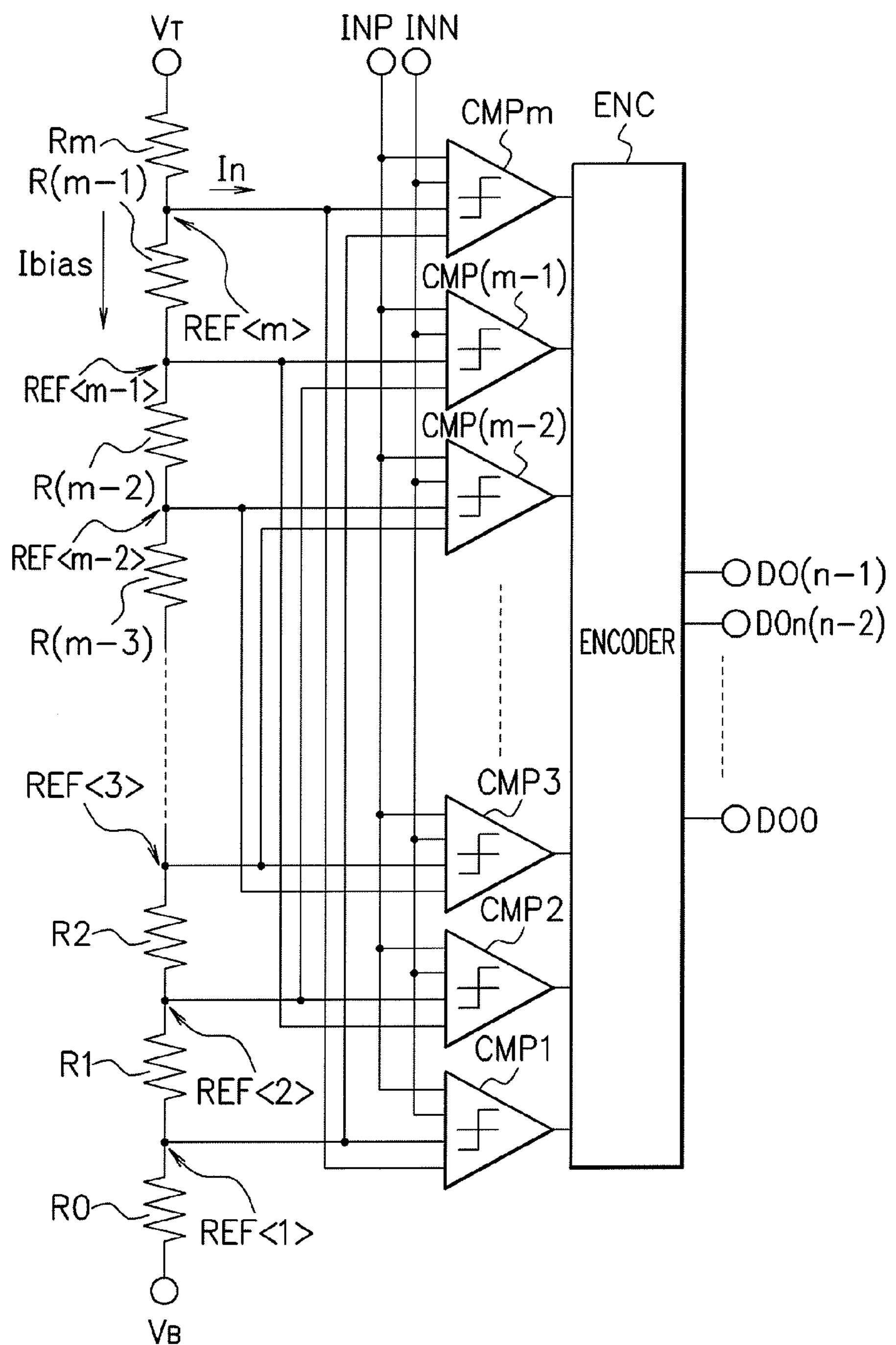

F I G. 6B
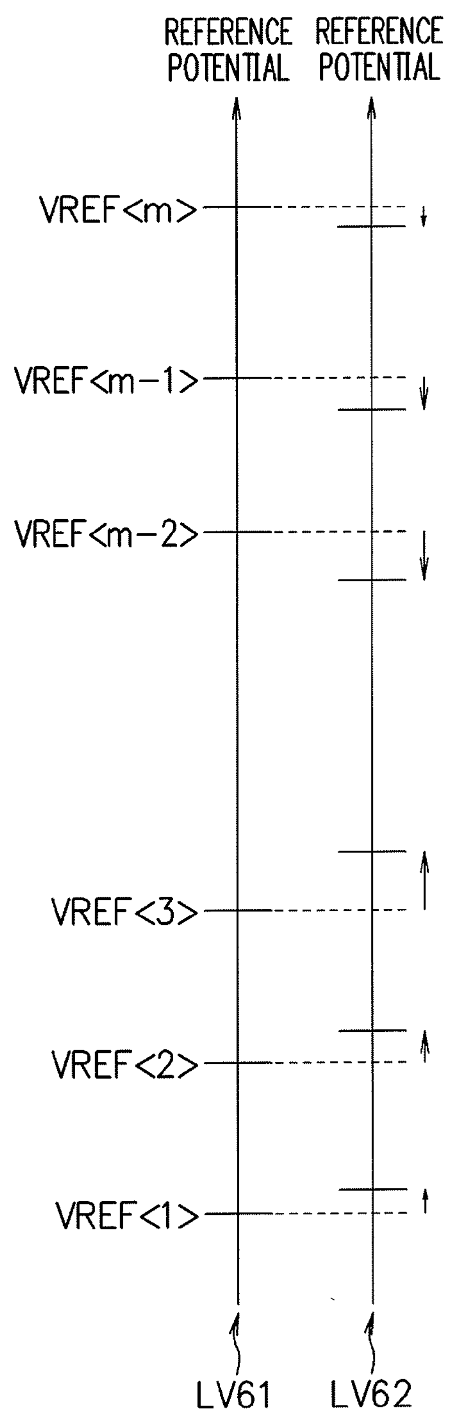

72N
72P
74
VOUTP
VOUTN
SW1N
VINN
VREFN(i)
SW2N
SW3N
75N
76N
73
71P
71N
SW3P
VC
75P
76P
SW1P
SW2P
VINP
VREFP<i>

F I G. 8A
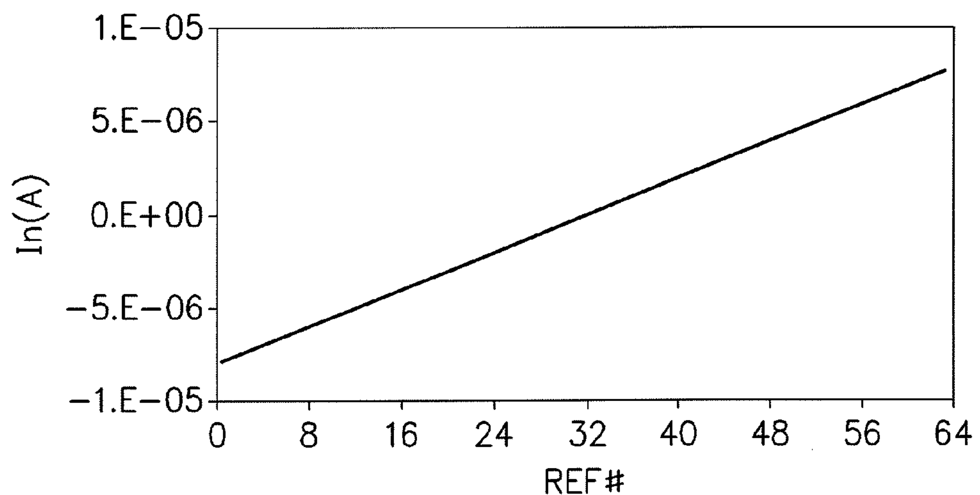
F I G. 8B
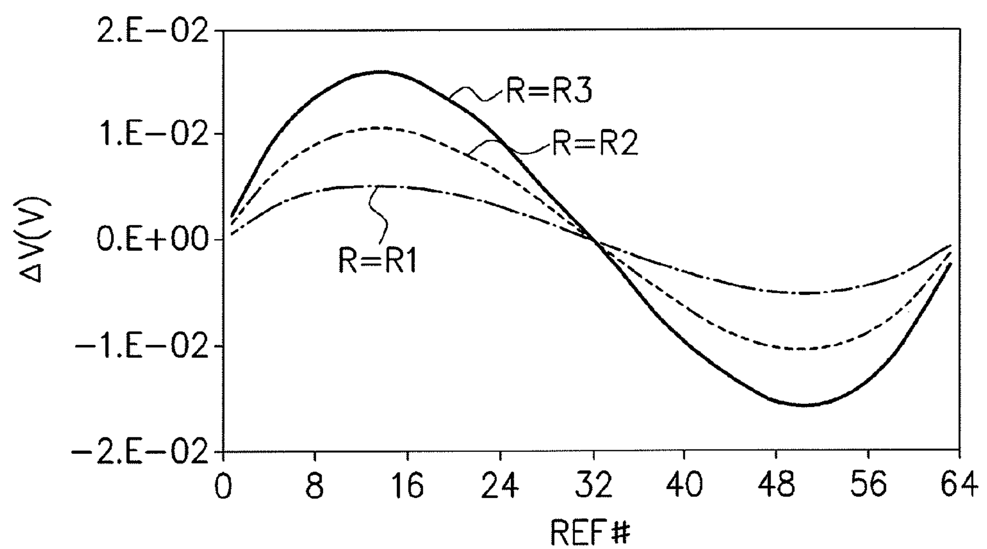

F I G. 9
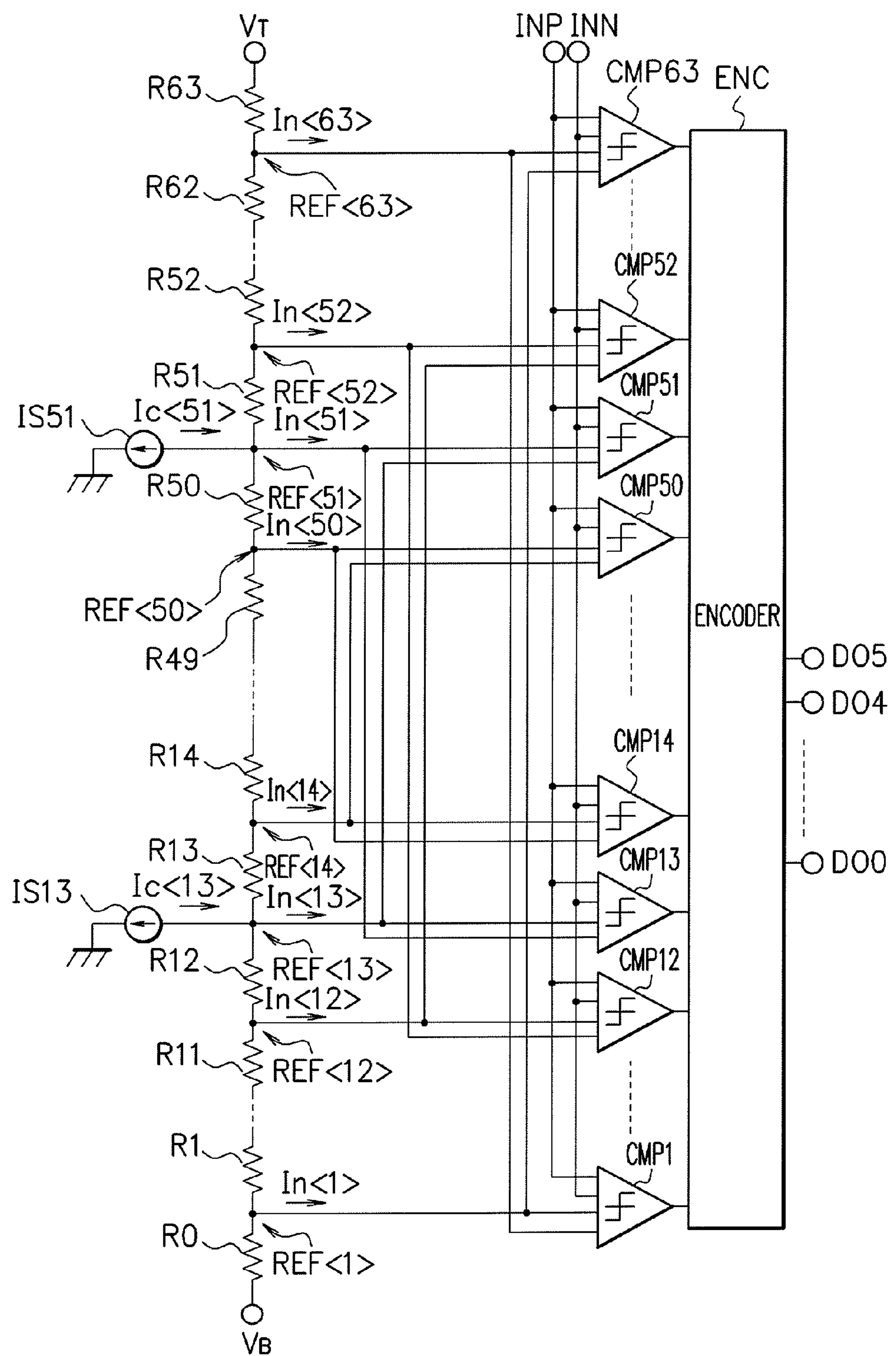

F I G. 10
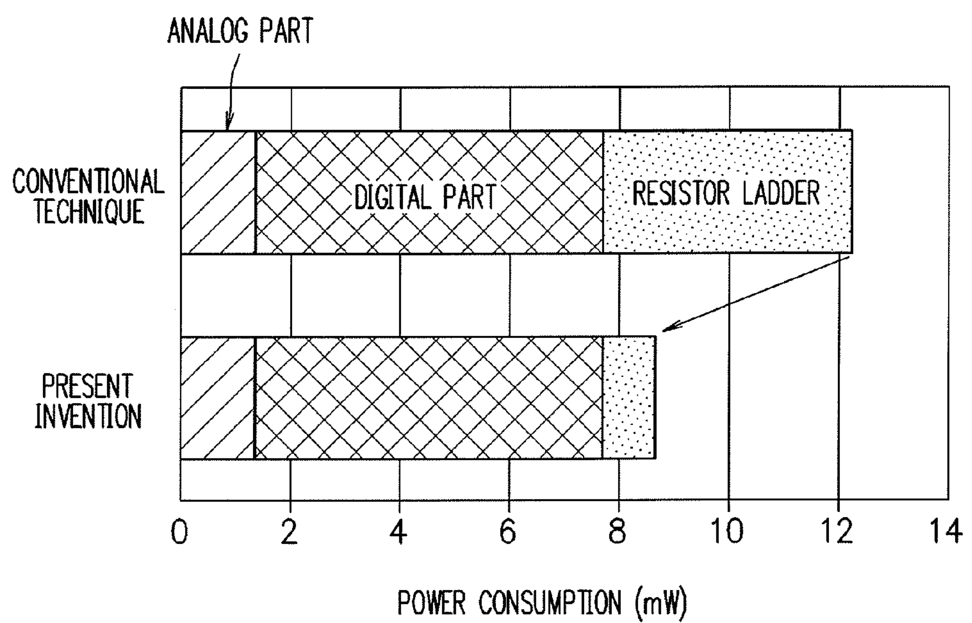

ANALOG-DIGITAL CONVERTER

CROSS-REFERENCE TO RELATED APPLICATIONS

This application is a National Phase application of PCT/JP2013/065631, filed on Jun. 5, 2013, which claims priority to Japanese Patent Application No. 2012-128031, filed on Jun. 5, 2012. The disclosures of the prior applications are incorporated in their entirety by reference.

TECHNICAL FIELD

The present invention relates to an analog-digital converter (AD converter).

BACKGROUND ART

FIG. 6A is a diagram illustrating a configuration example of a parallel-type analog-digital converter (AD converter). FIG. 6A illustrates a parallel-type AD converter (flash AD converter) that converts input analog input signals to n-bit (n being a natural number) digital signals DO[n-1:0]. In FIG. 6A, R0 to Rm ($m=2^n-1$) represent resistors, CMP1 to CMPm represent comparators (comparators), and ENC represents an encoder.

The resistors R0 to Rm are connected in series between a power supply terminal to which a reference voltage $V_B$ on the low potential side is supplied and a power supply terminal to which a reference voltage $V_T$ on the high potential side is supplied in the order of the resistors R0, R1, R2, . . . , R(m−3), R(m−2), R(m−1), and Rm. With i being an integer of 1 to m, a potential at a connection point REF<i> between the resistor R(i−1) and the resistor Ri is input to the comparators CMP1 to CMPm as a comparison reference potential VREF<i>. That is, a resistor ladder circuit configured by the resistors R0 to Rm resistance-divides the voltage between the voltage $V_B$ and the voltage $V_T$ to thereby generate the comparison reference potentials VREF<i> and supplies them to the comparators CMP1 to CMPm.

To the comparator CMPi, an analog input signal VINP input through an input terminal INP and an analog input signal VINN input through an input terminal INN are input. Further, to the comparator CMPi, the comparison reference potential VREF<i> being the potential at the connection point REF<i> in the resistor ladder circuit and a comparison reference potential VREF<m−i+1> being a potential at a connection point REF<m−i+1> in the resistor ladder circuit are input. The comparator CMPi compares a difference (a difference voltage) between the comparison reference potential VREF<i> and the analog input signal VINP and a difference (a difference voltage) between the comparison reference potential VREF<m−i+1> and the analog input signal VINN to output a result of the comparison. The encoder ENC receives results of the comparisons of the respective comparators CMPi to encode them and converts the resultants to the digital signals DO[n-1:0] to output them.

In the previously described parallel-type AD converter, the comparators are made to operate in parallel and perform the comparisons of the analog input signals and the plural comparison reference potentials in parallel, and thereby AD conversion can be performed at high speed. On the other hand, in the case of an n-bit parallel-type AD converter (total-bit flash AD converter), for example, $(2^n-1)$ pieces of comparators are required and power consumption increases. However, in recent years, achievement of low power of the comparators advances, and power consumption in the resistor ladder circuit accounts for a large percentage of power consumption of the parallel-type AD converter.

Here, in the parallel-type AD converter illustrated in FIG. 6A, the resistor ladder circuit that supplies the comparison reference potentials VREF<i> to the comparators CMP1 to CMPm and is configured by the resistors R0 to Rm is an important element circuit, and the accuracy of the resistor ladder circuit affects the accuracy of the whole parallel-type AD converter. Noises from the comparators CMP1 to CMPm are one of the causes of accuracy deterioration of the resistor ladder circuit. By noise currents In to generate in the process of operation of the comparators CMP1 to CMPm, the potentials VREF<i> at the connection points REF<i> in the resistor ladder circuit vary, and with respect to an ideal comparison reference potential indicated by LV61 in FIG. 6B, for example, the comparison reference potential varies as indicated by LV62. The variation in the comparison reference potential VREF<i> caused by the noise currents In increases a conversion error in the AD conversion and thereby the accuracy of the parallel-type AD converter deteriorates. Conventionally, a bias current Ibias in the resistor ladder circuit has been set to be sufficiently larger than the noise current In and an effect caused by the noise currents In has been decreased extremely, and thereby the accuracy deterioration of the parallel-type AD converter has been suppressed.

There has been proposed a technique of suppressing an effect of kickback noise to generate because of switching operations while suppressing an increase in circuit formation area in an AD converter provided with a switched capacitor integration circuit (see Patent Literature 1).

However, when the bias current Ibias in the resistor ladder circuit is set to be sufficiently larger than the noise current In in order to suppress the accuracy deterioration of the parallel-type AD converter as described previously, there is caused a problem that the power consumption in the resistor ladder circuit increases.

CITATION LIST

Patent Literature

Patent Literature 1: Japanese Laid-open Patent Publication No. 2009-33303

SUMMARY OF INVENTION

Technical Problem

The present invention has an object to suppress a variation in comparison reference potential while suppressing an increase in power consumption, and to suppress accuracy deterioration of a parallel-type AD converter.

Solution to Problem

An analog-digital converter according to the present invention is an analog-digital converter converting input analog input signals to digital signals, the analog-digital converter including: a plurality of comparators that receive comparison reference potentials different from one another and compare the comparison reference potentials and the received analog input signals; an encoder that encodes outputs of the plurality of comparators and outputs the digital signals; and a resistor ladder circuit that includes a plurality of resistors connected in series and resistance-divides a reference voltage to generate the comparison reference potentials and supplies the comparison reference potentials to the comparators through output nodes each positioned between the resistors, in which the resistor ladder circuit includes a correction circuit that corrects a variation in the comparison reference potential caused by noise currents that the comparators generate by supplying a current to the output nodes.

Advantageous Effects of Invention

According to the present invention, by a correction circuit in a resistor ladder circuit, a variation in comparison reference potential caused by noise currents that comparators generate is corrected, thus making it possible to decrease a bias current in the resistor ladder circuit and to suppress accuracy deterioration in analog-digital conversion. Consequently, it is possible to suppress an effect caused by the noise currents that the comparators generate while suppressing an increase in power consumption, and it becomes possible to provide a low power consumption and high precision analog-digital converter.

BRIEF DESCRIPTION OF DRAWINGS

FIG. 1 is a diagram illustrating a configuration example of an analog-digital converter in a first embodiment of the present invention;

FIG. 2 is a diagram illustrating a configuration example of an analog-digital converter in a second embodiment of the present invention;

FIG. 3 is a diagram illustrating a configuration example of a monitor circuit of noise currents in the second embodiment;

FIG. 4A is a diagram illustrating a configuration example of an analog-digital converter in a fourth embodiment of the present invention;

FIG. 4B is a view illustrating an example of resistance values of resistors included in a resistor ladder circuit in the fourth embodiment;

FIG. 4C is a view illustrating a potential variation amount in the fourth embodiment;

FIG. 5 is a diagram illustrating another configuration example of the analog-digital converter in the embodiment of the present invention;

FIG. 6A is a diagram illustrating a configuration example of a parallel-type analog-digital converter;

FIG. 6B is a view used for explaining a variation in comparison reference potential in the parallel-type analog-digital converter;

FIG. 8A is a view illustrating an example of a noise current to flow in a resistor ladder circuit;

FIG. 8B is a view illustrating an example of a potential variation in the resistor ladder circuit;

FIG. 9 is a diagram illustrating a configuration example of an analog-digital converter in a third embodiment of the present invention; and FIG. 10 is a view illustrating power consumption of the analog-digital converter in the third embodiment.

DESCRIPTION OF EMBODIMENTS

Figure 7:
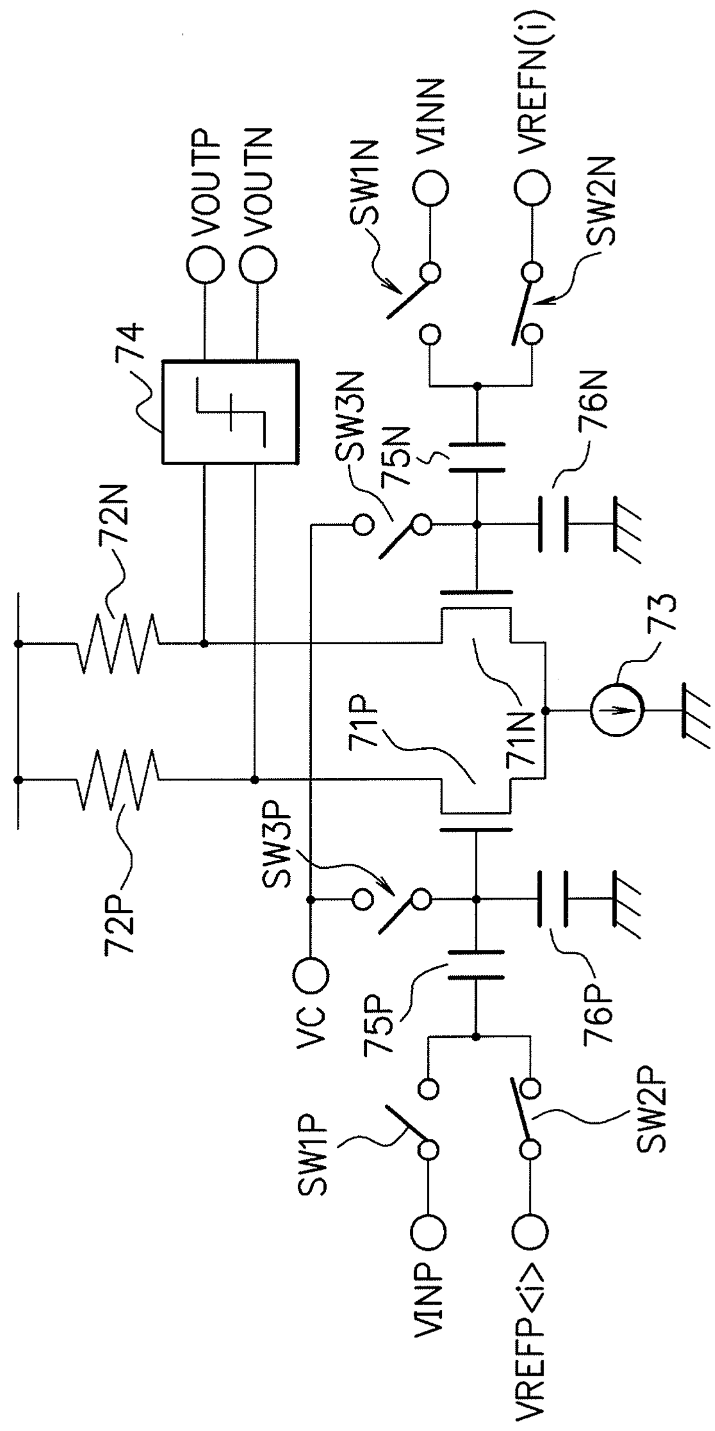
FIG. 7 is a diagram illustrating a configuration example of a comparator to be used in a parallel-type analog-digital converter.

Hereinafter, there will be explained embodiments of the present invention based on the drawings.

First, there will be explained noise currents that comparators to be used in a parallel-type analog-digital converter (AD converter) generate. FIG. 7 is a diagram illustrating a configuration example of a comparator to be used in a parallel-type AD converter. FIG. 7 illustrates as one example a comparator having a switched capacitor circuit to be used heavily in a parallel-type AD converter as an input unit. The comparator illustrated in FIG. 7 includes: MOS (metal oxide semiconductor) transistors 71P and 71N; resistors 72P and 72N; a current source 73; an analog latch 74; capacitors 75P and 75N; and switches SW1P, SW1N, SW2P, SW2N, SW3P, and SW3N.

The transistors 71P and 71N are differential pair transistors conducting amplification and compose a drive element. Sources of the transistors 71P and 71N are connected to the current source 73. Further, a drain of the transistor 71P is connected to one end of the resistor 72P composing a load element, and a drain of the transistor 71N is connected to one end of the resistor 72N composing a load element. The other ends of the resistors 72P and 72N are connected to a power supply voltage (Vcc).

A gate of the transistor 71P is connected to one electrode of the capacitor 75P being a sampling capacitor. To the other electrode of the capacitor 75P, a positive-phase analog input signal VINP is supplied via the switch SW1P and a positive-phase comparison reference potential VREFP<i> is supplied via the switch SW2P. Further, a gate of the transistor 71N is connected to one electrode of the capacitor 75N being a sampling capacitor. To the other electrode of the capacitor 75N, a negative-phase analog input signal VINN is supplied via the switch SW1N and a negative-phase comparison reference potential VREFN<i> is supplied via the switch SW2N. For example, when the positive-phase comparison reference potential VREFP<i> is set to a potential VREF<i>, the negative-phase comparison reference potential VREFN<i> is a potential VREF<m−i+1>. Further, to a connection point between the gate of the transistor 71P and the one electrode of the capacitor 75P and a connection point between the gate of the transistor 71N and the one electrode of the capacitor 75N, a common potential VC can be supplied via the switches SW3P and SW3N.

The analog latch 74 receives a potential at a connection point between the drain of the transistor 71P and the resistor 72P and a potential at a connection point between the drain of the transistor 71N and the resistor 72N as an input, performs a judgment operation of the inputs to judge the inputs to be a value of "1" or "0" finally, and outputs judgment results as output signals VOUTP and VOUTN. Incidentally, capacitors 76P and 76N illustrated in FIG. 7 are parasitic capacitors.

When the comparator illustrated in FIG. 7 is in a reset period, the switches SW1P and SW1N are brought into a non-continuity state (an open state, an off state) and the switches SW2P and SW2N are brought into a continuity state (a closed state, an on state), and the comparison reference potential VREFP<i> is supplied to the one electrode of the capacitor 75P and the comparison reference potential VREFN<i> is supplied to the one electrode of the capacitor 75N. Then, when the comparator is in a comparing period following the reset period, the switches SW1P and SW1N are brought into a continuity state (a closed state, an on state) and the switches SW2P and SW2N are brought into a non-continuity state (an open state, an off state), and the analog input signal VINP is supplied to the one electrode of the capacitor 75P and the analog input signal VINN is supplied to the one electrode of the capacitor 75N. As above, the respective switches SW1P, SW1N, SW2P, and SW2N are controlled properly, and thereby the comparator compares a difference (a difference voltage) between the comparison reference potential VREFP<i> and the analog input signal VINP and a difference (a difference voltage) between the comparison reference potential VREFN<i> and the analog input signal VINN to output a result of the comparison.

Here, when capacitance values of the capacitors 75P and 75N being sampling capacitors are set to Cs and capacitance values of the parasitic capacitors 76P and 76N are set to Cp, a noise current Inp<i> on the positive-phase side and a noise current Inn<i> on the negative-phase side to be generated in the process of operation of the comparator are expressed by (Expression 1). Incidentally, $t_c$ represents a cycle time (=1/operating frequency).

[Mathematical Expression 1]

$$Inp\langle i\rangle = \frac{Ceff(VREFP\langle i\rangle - VINP)}{t_c} \quad \text{(Expression 1)}$$

$$Inn\langle i\rangle = \frac{Ceff(VREFN\langle i\rangle - VINN)}{t_c}$$

$$Ceff = \frac{Cp \cdot Cs}{Cp + Cs}$$

Thus, a noise current In<i> to flow to a connection point REF<i> corresponding to an output node of a comparison reference potential VREF<i> in a resistor ladder circuit is expressed by (Expression 2)

[Mathematical Expression 2]

$$In\langle i\rangle = Inp\langle i\rangle + Inn\langle m-i+1\rangle = \frac{2Ceff(VREF\langle i\rangle - Vcom)}{t_c} \quad \text{(Expression 2)}$$

$$\text{where it is } Vcom \equiv \frac{VINP + VINN}{2}.$$

As is clear from the aforementioned (Expression 2), the noise current In<i> to flow to the connection point REF<i> does not rely on an input signal, and is determined only by the position of the connection point REF<i> in the resistor ladder circuit. There is illustrated one example of a noise current In to flow to a resistor ladder circuit configured by 64 pieces of resistors, namely to a resistor ladder circuit provided in a 6-bit parallel-type AD converter in FIG. 8A, and there is illustrated one example of a potential variation ΔV at the connection point REF<i> caused by the noise current In in FIG. 8B. As illustrated in FIG. 8A, the noise current In increases in magnitude toward, of the resistor ladder circuit, end portions from a center portion. Further, the potential variation ΔV caused by the noise current In to flow to the resistor ladder circuit has a characteristic pattern illustrated in FIG. 8B. That is, the potential variation is small at the both ends and the center portion of the resistor ladder circuit, and becomes maximum at positions about 20% of a ladder length away from the both ends. Further, with regard to resistance values R of the resistors configuring the resistor ladder circuit in FIG. 8B, R1<R2<R3 is set, and the larger the resistance value is, the larger the potential variation becomes.

As above, an amount of variation in the potential VREF<i> at the connection point REF<i> caused by the noise current In<i> does not rely on an input signal. Thus, when a circuit configuration and operation conditions such as a reference voltage to be supplied to the resistor ladder circuit and an operating frequency are determined, it becomes possible to predict the amount of variation in the potential VREF<i> at the connection point REF<i> beforehand and correct it.

First Embodiment

There will be explained a first embodiment of the present invention.

An AD converter in the first embodiment supplies a current that is the same in magnitude as the noise current In<i> generated by the comparator and flows in a reverse direction to the connection point REF<i> in the resistor ladder circuit corresponding to the output node of the comparison reference potential VREF<i>, to thereby offset the noise current In<i> and suppress the potential variation in the resistor ladder circuit. FIG. 1 is a diagram illustrating a configuration example of an AD converter in the first embodiment. FIG. 1 illustrates a parallel-type AD converter that converts input analog input signals to n-bit (n being a natural number) digital signals DO[n-1:0] (a flash AD converter) as one example. In FIG. 1, R0 to Rm ($m=2^n-1$) represent resistors, and IS1 to ISm represent current sources. Further, CMP1 to CMPm represent comparators (comparators), and ENC represents an encoder.

The resistors R0 to Rm are connected in series between, for example, a power supply terminal to which a voltage $V_B$ (a reference voltage on the low potential side) is supplied and a power supply terminal to which a voltage $V_T$ (a reference voltage on the high potential side) is supplied in the order of the resistors R0, R1, R2, R3, . . . , R(m−3), R(m−2), R(m−1), and Rm. A connection point REF<i> between the resistor R(i−1) and the resistor R(i) corresponds to the output node of the comparison reference potential VREF<i>, and a potential at the connection point REF<i> is input to the comparators CMP1 to CMPm as the comparison reference potential VREF<i>. Incidentally, i is a subscript and is an integer of 1 to m. That is, a resistor ladder circuit configured by the resistors R0 to Rm resistance-divides the voltage between the voltage $V_B$ and the voltage $V_T$ to thereby generate the comparison reference potentials VREF<i> and supply the comparison reference potentials VREF<i> to the comparators CMP1 to CMPm.

The comparator CMPi is the comparator illustrated in FIG. 7 as an example, for example. An input of the comparator CMPi is connected to input terminals INP and INN, and analog input signals VINP and VINN are input to the comparator CMPi. Further, the input of the comparator CMPi is connected to the connection point REF<i> between the resistor R(i−1) and the resistor R(i) and to a connection point REF<m−i+1> between the resistor R(m−i) and the resistor R(m−i+1), and the comparison reference potential VREF<i> and a comparison reference potential VREF<m−i+1> are input to the comparator CMPi. The comparator CMPi compares a difference (a difference voltage) between the comparison reference potential VREF<i> and the analog input signal VINP and a difference (a difference voltage) between the comparison reference potential VREF<m−i+1> and the analog input signal VINN to output a result of the comparison. The encoder ENC receives results of the comparisons of the respective comparators CMPi, encodes them, and converts the resultants to the digital signals DO[n-1:0] to output them.

The current source ISi is a correction current source used for offsetting the noise current In<i> that the comparator CMPi generates. The current source ISi is connected to the connection point REF<i> in the resistor ladder circuit, and supplies a current Ic<i> that is the same in magnitude as the noise current In<i> that the comparator generates and flows in a reverse direction to the connection point REF<i>. This makes it possible to offset the noise current In<i> that the comparator generates by the correction current Ic<i> that the current source ISi supplies, and to suppress a variation in the potential VREF<i> at the connection point REF<i> in the resistor ladder circuit.

Here, the magnitude of the correction current Ic<i> that the current source ISi being a correction current source supplies is small as compared to a normal bias current in the resistor ladder circuit, (which is about one several hundredth of the normal bias current, for example), and thus power consumed by the current source ISi is hardly increased. Incidentally, the current source ISi provided for supplying the correction current Ic<i> does not have to be provided for each of the connection points REF<1> to REF<m> in the resistor ladder circuit.

According to the first embodiment, in the resistor ladder circuit, the current source ISi supplies the correction current Ic<i> corresponding to the noise current In<i> that the comparator generates to the connection point REF<i> corresponding to the output node of the comparison reference potential VREF<i>. This makes it possible to offset the noise current In<i> that the comparator generates by the correction current Ic<i> that the current source ISi supplies, decrease a bias current in the resistor ladder circuit, and suppress accuracy deterioration in the AD conversion. Thus, it is possible to suppress an effect caused by the noise currents that the comparators generate while suppressing an increase in power consumption, and to fabricate a low power consumption and high precision AD converter.

Second Embodiment

Next, there will be explained a second embodiment of the present invention.

A potential variation ΔV<i> at the connection point REF<i> in the resistor ladder circuit caused by the noise current In<i> that the comparator generates is expressed by (Expression 3).

[Mathematical Expression 3]

$$\Delta V\langle i\rangle = \frac{R\cdot Ceff\cdot i(N-i)\{\Delta V_q(N+i)-3(Vcom-V_B)\}}{3t_c} \qquad \text{(Expression 3)}$$

$$Ceff = \frac{Cp\cdot Cs}{Cp+Cs}$$

$$\Delta V_q = \frac{V_T-V_B}{N}$$

$$Vcom = \frac{VINP+VINN}{2}$$

In aforementioned (Expression 3), R represents a resistance value of the resistor configuring the resistor ladder circuit, Cs represents a capacitance value of the sampling capacitor provided in the comparator, and Cp represents a capacitance value of the parasitic capacitor in the comparator. Further, N represents the number of resistors configuring the resistor ladder circuit (the number of potential ranges divided by the comparison reference potentials that the resistor ladder circuit generates), $V_T$ represents a reference voltage on the high potential side, $V_B$ represents a reference voltage on the low potential side, and $t_c$ represents a cycle time (=1/operating frequency). As is clear from aforementioned (Expression 3), the potential variation ΔV<i> at the connection point REF<i> caused by the noise current In<i> does not rely on an input signal, but relies on an operating frequency of the comparator, a capacitance value of the parasitic capacitor, and the like to thereby change. For example, the comparator is sometimes designed with the operating frequency falling within a range of 500 MHz to 1 GHz, or the like, for example, and it is sometimes impossible to predict the potential variation ΔV<i> at the connection point REF<i> corresponding to the output node of the comparison reference potential VREF<i> beforehand.

Thus, in the second embodiment, a monitor circuit to measure the noise currents that the comparators generate, and a control circuit to control the correction current to be supplied to the connection point REF<i> in accordance with a result of the measurement are provided. Thereby, even if the noise current generated by the comparator changes by the operating frequency of the comparator, the capacitance value of the parasitic capacitor, and the like, it becomes possible to appropriately supply the correction current to the connection point REF<i>, offset the noise current In<i>, and suppress the potential variation in the resistor ladder circuit.

FIG. 2 is a diagram illustrating a configuration example of an AD converter in the second embodiment. FIG. 2 illustrates a parallel-type AD converter that converts input analog input signals to 6-bit digital signals DO5 to DO0 as one example. In FIG. 2, R0 to R63 represent resistors, IS1 to IS63 represent current sources, CMP1 to CMP63 represent comparators (comparators), and ENC represents an encoder. Further, 21 represents a monitor circuit (IDET), and 22 represents a current control circuit (ICTRL). The resistors R0 to R63, the current sources IS1 to IS63, and the comparators CMP1 to CMP63 correspond to ones in which each value of m of the resistors R0 to Rm, the current sources IS1 to ISm, and the comparators CMP1 to CMPm in the first embodiment is replaced with 63, and overlapping explanations of them are omitted.

The monitor circuit 21 generates noise currents similar to those generated by the comparators to measure the noise currents. The current control circuit 22, based on the noise currents measured by the monitor circuit 21, controls the current sources IS1 to IS63 to adjust correction currents Ic<1> to Ic<63>.

For example, as illustrated in FIG. 3, the monitor circuit 21 simulates noise currents that the comparators CMP1 to CMP63 generate by using a comparator DCMP for monitor to detect the currents. The monitor circuit 21 includes: MOS transistors 31P and 31N; resistors 32P and 32N; and current sources 33P and 33N. Of the transistor 31P, a source is connected to the current source 33P and a drain is connected to a power supply voltage (Vcc) via the resistor 32P, and to a gate, a control voltage VRP is supplied. Further, of the transistor 31N, a source is connected to the current source 33N and a drain is connected to a power supply voltage (Vcc) via the resistor 32N, and to a gate, a control voltage VRN is supplied.

A potential of the source of the transistor 31P is input to the comparator DCMP for monitor as a comparison reference potential VREFP, and a potential of the source of the transistor 31N is input to the comparator DCMP for monitor as a comparison reference potential VREFN. Here, the comparison reference potentials VREFP and VREFN, similarly to comparison reference potentials to be input to the comparators CMP1 to CMP63, satisfy the relationship in which one is a potential VREF<i> and the other is a potential VREF<63−i+1>, and the control voltages VRP and VRN are controlled in such a manner that the potentials of the sources of the transistors 31P and 31N become such potentials. The current control circuit 22 is connected to a connection point between the drain of the transistor 31P and the resistor 32P and a connection point between the drain of the transistor 31N and the resistor 32N.

Further, to the comparator DCMP for monitor, analog input signals VINP and VINN to be input through input terminals INP and INN are supplied. The comparator DCMP for monitor operates similarly to the comparators CMP1 to CMP63 and compares a difference (a difference voltage) between the comparison reference potential VREFP and the analog input signal VINP and a difference (a difference voltage) between the comparison reference potential VREFN and the analog input signal VINN to output a result of the comparison. Thus, by the operation of the comparator DCMP for monitor, a noise current similar to the noise currents of the comparators CMP1 to CMP63 is generated. By this noise current, a potential at the connection point between the drain of the transistor 31P and the resistor 32P and a potential at the connection point between the drain of the transistor 31N and the resistor 32N change. The current control circuit 22, based on this potential change, controls the current sources IS1 to IS63 to supply the correction currents Ic<1> to Ic<63> corresponding to noise currents In<1> to In<63> that the comparators CMP1 to CMP63 generate.

According to the second embodiment, even if the noise current that the comparator generates changes by an operating frequency of the comparator, a capacitance value of the parasitic capacitor, and the like, it is possible to appropriately supply the correction current corresponding to the generated noise current, offset the noise current In<in> that the comparator generates by the correction current Ic<i> that the current source ISi supplies, decrease a bias current in the resistor ladder circuit, and suppress accuracy deterioration in the AD conversion. Thus, it is possible to suppress an effect caused by the noise currents that the comparators generate while suppressing an increase in power consumption, and to fabricate a low power consumption and high precision AD converter.

Incidentally, in the second embodiment as well, the current source ISi provided for supplying the correction current Ic<i> does not have to be provided for each of the connection points REF<1> to REF<m> in the resistor ladder circuit. The current source ISi may also be provided only for the connection point REF<i> where the variation in the potential VREF<i> caused by the noise current In<i> is expected to be large, for example, and thereby it is possible to improve the potential variation in the resistor ladder circuit caused by the noise currents In<i>.

Third Embodiment

Next, there will be explained a third embodiment of the present invention.

In the first and second embodiments, for each of the connection points REF<1> to REF<m> in the resistor ladder circuit, the current source ISi provided for supplying the correction current Ic<i> is provided, but as described previously, the current source ISi is provided only for the connection point REF<i> where the variation in the potential VREF<i> caused by the noise current In<i> is expected to be large, and thereby it is possible to improve the potential variation in the resistor ladder circuit caused by the noise currents In<i>.

In the third embodiment to be explained below, the current source ISi is provided for the connection point REF<i> where the variation in the potential VREF<i> in the resistor ladder circuit caused by the noise current In<i> is expected to be large. FIG. 9 is a diagram illustrating a configuration example of an AD converter in the third embodiment. In FIG. 9, for connection points REF<i> positioned at positions about 20% of a ladder length away from both ends of a resistor ladder circuit, where the potential variation is expected to be the largest, (connection points REF<13> and REF<51> in the case of a resistor ladder circuit configured by 64 pieces of resistors illustrated in FIG. 9 as an example), in other words, for output nodes of comparison reference potentials existing at the positions about 20% of the length away from output nodes of comparison reference potentials at the both ends of the resistor ladder circuit, the current source ISi is provided.

FIG. 9 illustrates a parallel-type AD converter that converts input analog input signals to 6-bit digital signals DO5 to DO0 as one example. In FIG. 9, R0 to R63 represent resistors, IS13 and IS51 represent current sources, CMP1 to CMP63 represent comparators (comparators), and ENC represents an encoder. The resistors R0 to R63 and the comparators CMP1 to CMP63 correspond to ones in which each value of m of the resistors R0 to Rm and the comparators CMP1 to CMPm in the first embodiment is replaced with 63, and the current sources IS13 and IS51 correspond to the current sources IS13 and IS51 of the current sources IS1 to ISm in the first embodiment, so that overlapping explanations of them are omitted.

As above, for the connection points REF<13> and REF<51> being the connection points at the positions about 20% of the ladder length away from the both ends of the resistor ladder circuit, where the potential variation is expected to be the largest, the current sources IS13 and IS51 are provided respectively, and thereby while suppressing both an increase in the number of circuits and an increase in power consumption, it is possible to obtain an effect of improving the potential variation of the resistor ladder circuit caused by the noise currents that the comparators generate and to fabricate a low power consumption and high precision AD converter, similarly to the previously described embodiments.

For example, FIG. 10 is a view illustrating the power consumption of the parallel-type AD converter in the third embodiment illustrated in FIG. 9, and as compared to a conventional parallel-type AD converter, in this embodiment, the power consumption in the resistor ladder circuit can be decreased by 80%, and further the power consumption of the entire AD converter can be decreased by 30%. Incidentally, FIG. 10 shows the result estimated by performing a calculation on the condition that a subranging-type parallel AD converter using a foreground calibration with a manufacturing process set to a 65 nm CMOS process is used, a power supply voltage is 0.8 V, a sampling frequency is 1 GHz, and the frequency of an input signal is 496 MHz.

Incidentally, FIG. 9 illustrates the example where in the parallel-type AD converter in the first embodiment, the current source ISi is provided for the connection point REF<i> where the variation in the potential VREF<i> in the resistor ladder circuit caused by the noise current In<i> is expected to be large, and further the above is similarly applicable also to the parallel-type AD converter in the second embodiment. Further, in the previously described example, the example where the current source ISi is provided for the connection points REF<i> positioned at the positions about 20% of the ladder length away from the both ends of the resistor ladder circuit is described, but even when for the connection points REF<i> in the range where the potential variation is expected to be large, for example, for the connection points REF<i> positioned at the positions 10% to 30% of the ladder length away from the both ends of the resistor ladder circuit, the current source ISi is provided, the effect of improving the potential variation in the resistor ladder circuit caused by the noise currents can be obtained. Further, it is also possible to provide the current source ISi for the plural connection points REF<i> including the connection points REF<i> positioned at the positions about 20% of the ladder length away from the both ends of the resistor ladder circuit.

Fourth Embodiment

Next, there will be explained a fourth embodiment of the present invention.

In the previously described first and second embodiments, the current source ISi to supply the correction current Ic<i> is provided for the connection point REF<i> in the resistor ladder circuit, to thereby offset the noise current In<i> that the comparator generates. In the fourth embodiment to be explained below, the noise currents In<i> that the comparators generate are not offset, but resistance values in the resistor ladder circuit are adjusted in such a manner that the potentials VREF<i> at the connection points REF<i> in the resistor ladder circuit including the potential variation caused by the noise currents In<i> become desired potentials.

FIG. 4A is a diagram illustrating a configuration example of an AD converter in the fourth embodiment. FIG. 4A illustrates a parallel-type AD converter that converts input analog input signals to 6-bit digital signals DO5 to DO0 as one example. In FIG. 4A, R0 to R63 represent resistors, CMP1 to CMP63 represent comparators (comparators), and ENC represents an encoder. The resistors R0 to R63 and the comparators CMP1 to CMP63 correspond to ones in which each value of m of the resistors R0 to Rm and the comparators CMP1 to CMPm in the first embodiment is replaced with 63, but in the fourth embodiment, resistance values of the resistors R0 to Rm are not the same and are different depending on the position of a resistor ladder circuit.

The potential variation ΔV<i> at the connection point REF<i> in the resistor ladder circuit caused by the noise current In<i> that the comparator generates can be calculated by (Expression 3) as described previously. In the fourth embodiment, the resistors in the resistor ladder circuit are designed so that a potential variation opposite to this potential variation ΔV<i> may be caused, and it is designed so that the potential variation may become 0 in a state of the noise currents In<i> generated by the comparators flowing. Therefore, in the parallel-type AD converter in the fourth embodiment, the resistance values of the resistors R0 to R63 configuring the resistor ladder circuit are set as indicated by a solid line 41 in FIG. 4B. That is, the resistance values of the resistors R0 to R63 configuring the resistor ladder circuit are normally all the same as indicated by a dotted line 42, but in this embodiment, the resistance is decreased at end portions of the resistor ladder circuit where the magnitude of the noise current In<i> is large and the resistance is increased at a center portion of the resistor ladder circuit where the magnitude of the noise current In<i> is small. Thereby, as illustrated in FIG. 4C, it is possible to improve a potential variation indicated by a dotted line 45 that is caused when the resistance values of the resistors R0 to R63 configuring the resistor ladder circuit are all made the same, and to suppress the potential variation caused by the noise current In<i> as indicated by a solid line 44.

Another Embodiment

Incidentally, in the previously described embodiments, the parallel-type AD converter (total-bit flash AD converter) has been explained as one example, but the present invention is not limited to this. The present invention is applicable also to a subranging-type AD converter <subranging AD converter> illustrated in FIG. 5, for example. FIG. 5 is a diagram illustrating another configuration example of the AD converter in the embodiment of the present invention. FIG. 5 illustrates, as one example, a subranging-type AD converter that converts an input analog input signal VIN to a (m+n)-bit (m and n being natural numbers) digital signal DO[1:m+n].

In FIG. 5, 51 represents a track-and-hold circuit, 52 represents an m-bit parallel-type AD converter (flash AD converter), and 53 represents a digital-analog converter (DA converter). 54 represents an arithmetic unit, 55 represents an n-bit parallel-type AD converter (flash AD converter), and 56 represents an encoder. The m-bit parallel-type AD converter 52 performs AD conversion processing of m bits on the high-order side of the digital signal DO[1:m+n], and the n-bit parallel-type AD converter 55 performs AD conversion processing of n bits on the low-order side of the digital signal DO[1:m+n]. The parallel-type AD converters 52 and 55 are each configured in the same manner as the parallel-type AD converters described in the previously described respective embodiments, thereby making it possible to decrease a circuit scale and to fabricate a low power consumption and high precision AD converter.

In the subranging-type AD converter illustrated in FIG. 5, the input analog input signal VIN is input to and held in the track and hold circuit 51 to be supplied to the m-bit parallel-type AD converter 52 and the arithmetic unit 54. The m-bit parallel-type AD converter 52 performs AD conversion processing by using the supplied analog input signal VIN, and a digital signal DO[n+1:m+n] of the digital signal DO[1:m+n] is output from the m-bit parallel-type AD converter 52. The digital signal DO[n+1:m+n] output from the m-bit parallel-type AD converter 52 is supplied to the DA converter 53 and is output to the encoder 56.

The digital signal DO[n+1:m+n] supplied to the DA converter 53 is DA converted and an analog signal corresponding to the digital signal DO[n+1:m+n] is output from the DA converter 53. Then, the analog signal output from the DA converter 53 is subtracted from the analog input signal VIN output from the track and hold circuit 51 by the arithmetic unit 54, and the residue is supplied to the n-bit parallel-type AD converter 55. Thereby, a residual component obtained by subtracting the analog signal corresponding to the digital signal DO[n+1:m+n] determined by the m-bit parallel-type AD converter 52 from the input analog input signal VIN is supplied to the n-bit parallel-type AD converter 55.

In the n-bit parallel-type AD converter 55, AD conversion processing of the analog signal supplied from the arithmetic unit 54 is performed and a digital signal DO[1:n] of the digital signal DO[1:m+n] is output to the encoder 56 from the n-bit parallel-type AD converter 55. The encoder 56 combines the digital signal DO[n+1:m+n] output from the m-bit parallel-type AD converter 52 and the digital signal DO[1:n] output from the n-bit parallel-type AD converter 55. In the way described above, the input analog input signal VIN is converted to the (m+n)-bit digital signal DO[1:m+n] to be output.

Incidentally, in the previously described respective embodiments, the comparator having the switched capacitor circuit as an input unit has been explained as an example, but the present invention is not limited to this, and even if a comparator having a configuration other than the above is used, the fundamental concept of the present invention to offset a noise current that the comparator generates is applicable. When a comparator different in configuration from the comparator having the switched capacitor circuit as an input unit is used, the noise current that the comparator generates has dependency different from the functions described in the previously described explanations, so that it is only necessary to determine a current value of a correction current and the like in accordance with the dependency.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

INDUSTRIAL APPLICABILITY

By a correction circuit in a resistor ladder circuit, a reference potential variation caused by noise currents that comparators generate is suppressed, and thereby it is possible to suppress an effect caused by the noise currents that the comparators generate while suppressing an increase in power consumption, and to provide a low power consumption and high precision analog-digital converter.

The invention claimed is:

1. An analog-digital converter converting input analog input signals to digital signals, the analog-digital converter, comprising:

a plurality of comparators that receive comparison reference potentials different from one another and compare the comparison reference potentials and the received analog input signals;

an encoder that encodes outputs of the plurality of comparators and outputs the digital signals; and a resistor ladder circuit that includes a plurality of resistors connected in series and resistance-divides a reference voltage to generate the comparison reference potentials and supplies the comparison reference potentials to the comparators through output nodes each positioned between the resistors, wherein the resistor ladder circuit includes a correction circuit that corrects a variation in the comparison reference potential that varies depending on positions of the output nodes to which the comparison reference potentials are supplied in the resistor ladder circuit and is caused by noise currents that the comparators generate by supplying a current corresponding to the positions of the output nodes in the resistor ladder circuit to each of the output nodes.

2. The analog-digital converter according to claim 1, wherein the currents that the correction circuit supplies to the output nodes are currents that are the same in magnitude as the noise currents that the comparators generate and flow in a reverse direction.

3. The analog-digital converter according to claim 2, wherein the correction circuit includes: a monitor circuit that simulates the noise currents that the comparators generate and detects the currents; and a current control circuit that adjusts the currents to be supplied to the output nodes based on the currents detected by the monitor circuit.

4. The analog-digital converter according to claim 1, wherein the currents that the correction circuit supplies to the output nodes are different from one another depending on the positions of the output nodes in the resistor ladder circuit.

5. The analog-digital converter according to claim 1, wherein the correction circuit is connected to all the output nodes of the comparison reference potentials in the resistor ladder circuit.

6. The analog-digital converter according to claim 1, wherein the correction circuit is connected to some of the output nodes of all the output nodes of the comparison reference potentials in the resistor ladder circuit.

7. The analog-digital converter according to claim 1, wherein the correction circuit is connected to the output nodes including at least the output nodes positioned at positions about 20% of a length away from the output nodes at both ends in the resistor ladder circuit.

8. The analog-digital converter according to claim 1, wherein the correction circuit is connected only to the output nodes positioned at positions about 20% of a length away from the output nodes at both ends in the resistor ladder circuit.

* * * * *